(12) United States Patent  (10) Patent No.: US 7,544,088 B2
Caveney et al.  (45) Date of Patent: *Jun. 9, 2009

(54) COMMUNICATIONS CONNECTOR WITH CRIMPED CONTACTS (75) Inventors: Jack E. Caveney, Hinsdale, IL (US); Scott M. Lesniak, Lockport, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/052,513

(22) Filed: Mar. 20, 2008

(65) Prior Publication Data

US 2008/0166925 A1    Jul. 10, 2008

Related U.S. Application Data

(63) Continuation of application No. 11/457,171, filed on Jul. 13, 2006, now Pat. No. 7,357,683.

(60) Provisional application No. 60/699,823, filed on Jul. 15, 2005.

(51) Int. Cl.
    *H01R 12/24* (2006.01)
(52) U.S. Cl. ............. 439/495; 439/941; 439/676; 439/76.1
(58) Field of Classification Search ......... 439/941, 439/676, 76.1, 495
    See application file for complete search history.

(56) References Cited

U.S. PATENT DOCUMENTS

| 4,684,183 | A | 8/1987 | Kinoshita et al. |
|---|---|---|---|
| 4,824,391 | A | 4/1989 | Ii |
| 5,569,056 | A | 10/1996 | Raimond |
| 5,647,767 | A | 7/1997 | Scheer et al. |
| 5,692,925 | A | 12/1997 | Bogese, II |
| 5,967,854 | A | 10/1999 | Craig |
| 5,997,358 | A | 12/1999 | Adriaenssens et al. |
| 6,155,882 | A | 12/2000 | Wu |
| 6,179,668 | B1 | 1/2001 | Kan |
| 6,231,397 | B1 | 5/2001 | de la Borbolla et al. |
| 6,454,573 | B2 | 9/2002 | Hayashi et al. |
| 6,533,588 | B1 | 3/2003 | Woith et al. |
| 6,547,597 | B2 | 4/2003 | Harris, IV |
| 6,568,955 | B2 * | 5/2003 | Hotea et al. ............. 439/495 |
| 6,729,913 | B2 | 5/2004 | Bruski et al. |
| 6,855,013 | B2 | 2/2005 | Chiang et al. |
| 7,252,554 | B2 | 8/2007 | Caveney et al. |
| 2003/0194908 | A1 | 10/2003 | Brown et al. |
| 2004/0184247 | A1 | 9/2004 | Adriaenssens et al. |
| 2006/0014410 | A1 | 1/2006 | Caveney |
| 2006/0160428 | A1 | 7/2006 | Hashim |

\* cited by examiner

*Primary Examiner*—Truc T Nguyen
(74) *Attorney, Agent, or Firm*—Robert A. McCann; Zachary J. Smolinski (57) ABSTRACT

A communications connector with a flexible printed circuit board is provided. The flexible printed circuit board is electronically and mechanically connected to the plug interface contacts of the jack near the plug/jack interface, in order to provide effective crosstalk compensation. The flexible printed circuit board has fingers at one end allowing it to flex as individual plug interface contacts are depressed when a plug is installed into the jack. The flexible printed circuit board, or a flexible portion of a printed circuit board, is provided with elongated extensions for certain conductors to accommodate the connection of six-contact or eight-contact plugs to the connector.

14 Claims, 12 Drawing Sheets

COMMUNICATIONS CONNECTOR WITH CRIMPED CONTACTS

CROSS-REFERENCE TO RELATED APPLICATIONS

This application is a continuation of U.S. patent application Ser. No. 11/457,171, entitled Communications Connector With Crimped Contacts, filed Jul. 13, 2006, which claims the benefit of U.S. Provisional Patent Application No. 60/699,823 filed Jul. 15, 2005. This application incorporates by reference in their entireties U.S. patent application Ser. No. 11/014,097, filed Dec. 15, 2004; U.S. patent application Ser. No. 11/055,344, filed Feb. 20, 2005; U.S. patent application Ser. No. 11/078,816, filed Mar. 11, 2005; U.S. patent application Ser. No. 11/099,110, filed Apr. 5, 2005; U.S. Provisional Application No. 60/587,416, filed Jul. 13, 2004; and U.S. Provisional Application No. 60/637,024, filed Dec. 17, 2004.

FIELD OF THE INVENTION

The present invention relates generally to electrical connectors, and more particularly, to a communication jack having crimped contacts secured to a flexible printed circuit.

BACKGROUND OF THE INVENTION

In the communications industry, as data transmission rates have steadily increased, crosstalk due to capacitive and inductive couplings among the closely spaced parallel conductors within the jack and/or plug has become increasingly problematic. Modular connectors with improved crosstalk performance have been designed to meet the increasingly demanding standards. Many of these improved connectors have included concepts disclosed in U.S. Pat. No. 5,997,358, the entirety of which is incorporated by reference herein. In particular, recent connectors have introduced predetermined amounts of crosstalk compensation to cancel offending near end crosstalk (NEXT). Two or more stages of compensation are used to account for phase shifts from propagation delay resulting from the distance between the compensation zone and the plug/jack interface. As a result, the magnitude and phase of the offending crosstalk is offset by the compensation, which, in aggregate, has an equal magnitude, but opposite phase.

Recent transmission rates, including those in excess of 500 MHz, have exceeded the capabilities of the techniques disclosed in the '358 patent. Thus, improved compensation techniques are needed.

BRIEF DESCRIPTION OF FIGURES ILLUSTRATING PREFERRED EMBODIMENTS

DETAILED DESCRIPTION OF THE PREFERRED EMBODIMENTS

Figure 1:
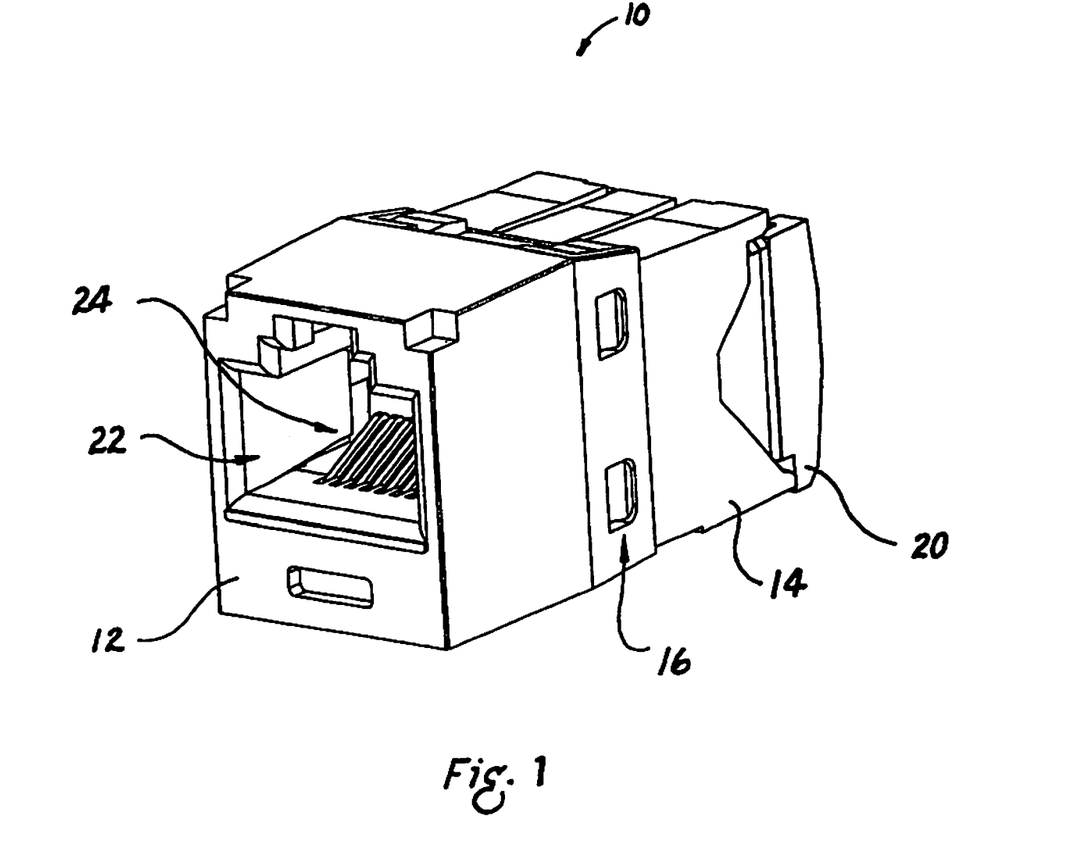
FIG. 1 is a front perspective view of a communications jack.

FIG. 1 is a perspective view of a communications jack 10 according to one embodiment of the present invention. The jack 10 includes a main jack housing 12 and a rear jack housing 14 attached to the main jack housing 12, for example via housing clips 16. The rear jack housing 14 may be provided with passageways for insulation-displacement contacts (IDCs) 18 (shown in FIG. 2). A wire cap 20 provides an interface to a twisted pair communication cable. Alternatively, a punch-down block may be incorporated into the communications jack 10. The main jack housing 12 comprises a receptacle 22 for receiving a communications plug, and plug interface contacts 24 within the receptacle 22 make contact with contacts of the plug.

Figure 2:
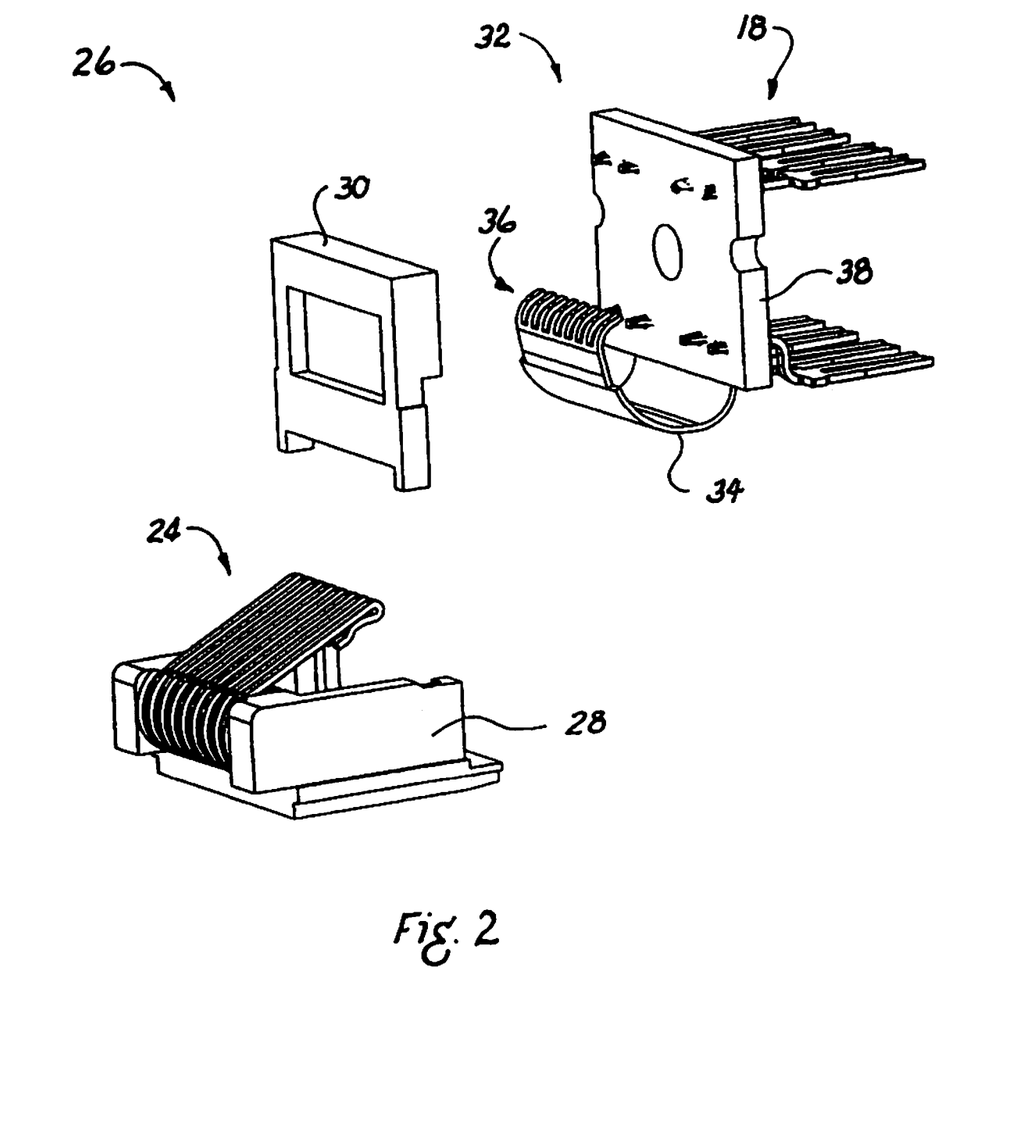
FIG. 2 is an exploded perspective view of a contact assembly showing the use of a printed circuit board having a flexible portion.

The plug interface contacts 24 are held within a contact carrier assembly 26 shown in FIG. 2. The contact carrier assembly 26 comprises a contact sled 28 and a vertical support 30 adapted to hold a printed circuit board (PCB) 32. The printed circuit board 32 comprises a flexible portion 34 having jack contact points 36 for attachment to the plug interface contacts 24. The PCB 32 further comprises a rigid portion 38 to which the IDCs 18 are electrically and mechanically attached (for example, via compliant pins). The PCB 32 provides electrical connection between the plug interface contacts 24 and the IDCs 18, and further provides crosstalk compensation for communication signals traveling through the communications jack 10.

Figure 3:
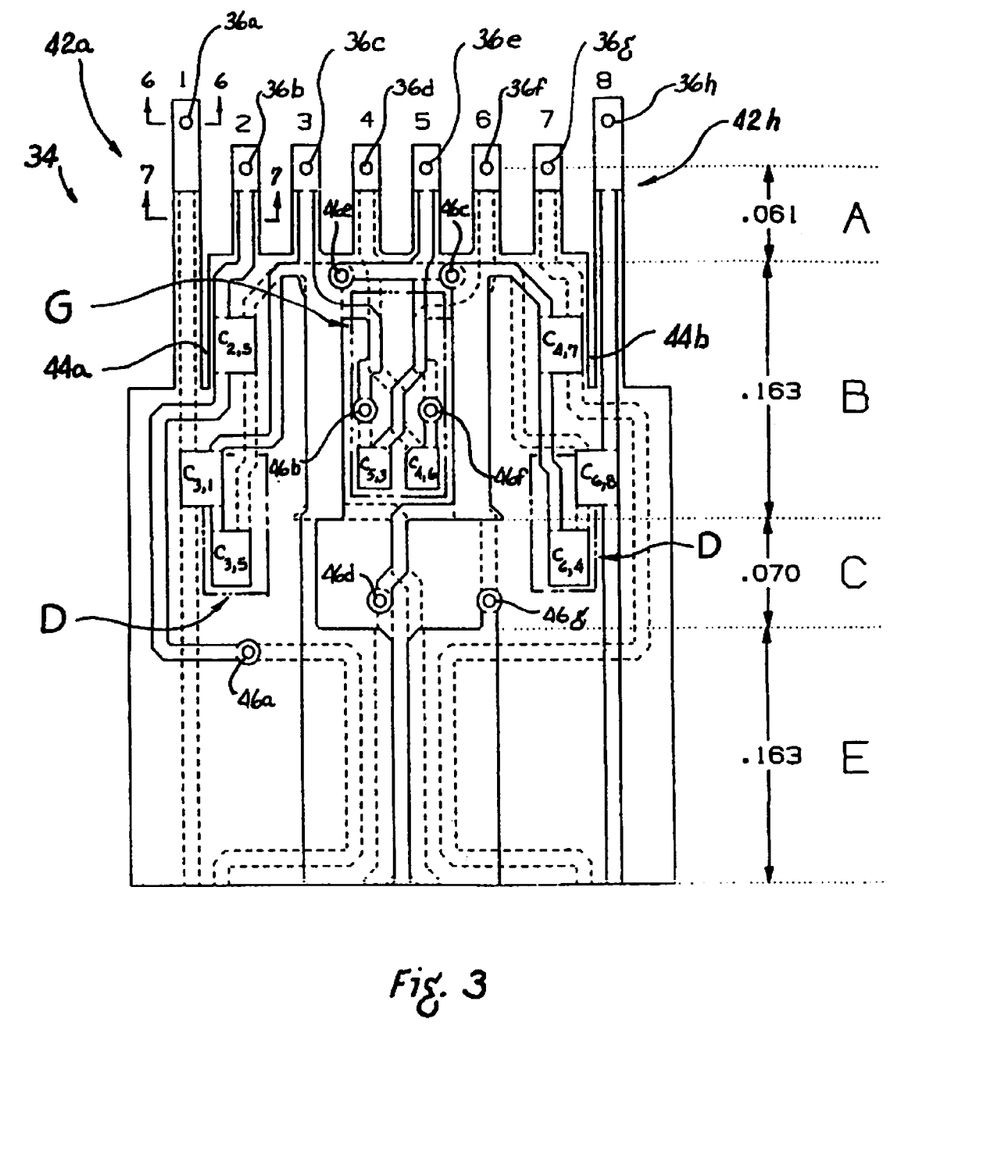
FIG. 3 is a plan view of a flexible portion of a printed circuit board.

A plan view of the flexible portion 34 of the PCB 32 is shown in FIG. 3. Jack contact points 36a-36h correspond to first through eighth plug interface contacts 24. Each of the first through eighth jack contact points 36a-36h has a corresponding conductive trace 1-8 on the PCB 32. In the plan view of FIG. 3, conductive traces along the top of the flexible portion 34 are shown with solid lines, and conductive traces along the bottom of the flexible portion 34 are shown with dotted lines.

The compensating circuitry of the PCB 32 is divided into zones similarly to the division shown in pending U.S. patent application Ser. No. 11/078,816 filed on Mar. 11, 2005. Specifically, the compensating circuitry of the present invention is divided into six Zones, A-F, as described in the '816 application, and further incorporates a seventh zone, Zone G.

Zone A is a transition zone from the jack contact points 36a-36h to the near-end crosstalk (NEXT) compensation zone.

Zone B is the NEXT compensation zone.

Zone C is a transition zone from the NEXT compensation zone to the NEXT crosstalk zone.

Zone D is a compensation zone to compensate for the jack contacts.

Zone E is a NEXT crosstalk zone.

Figure 8:
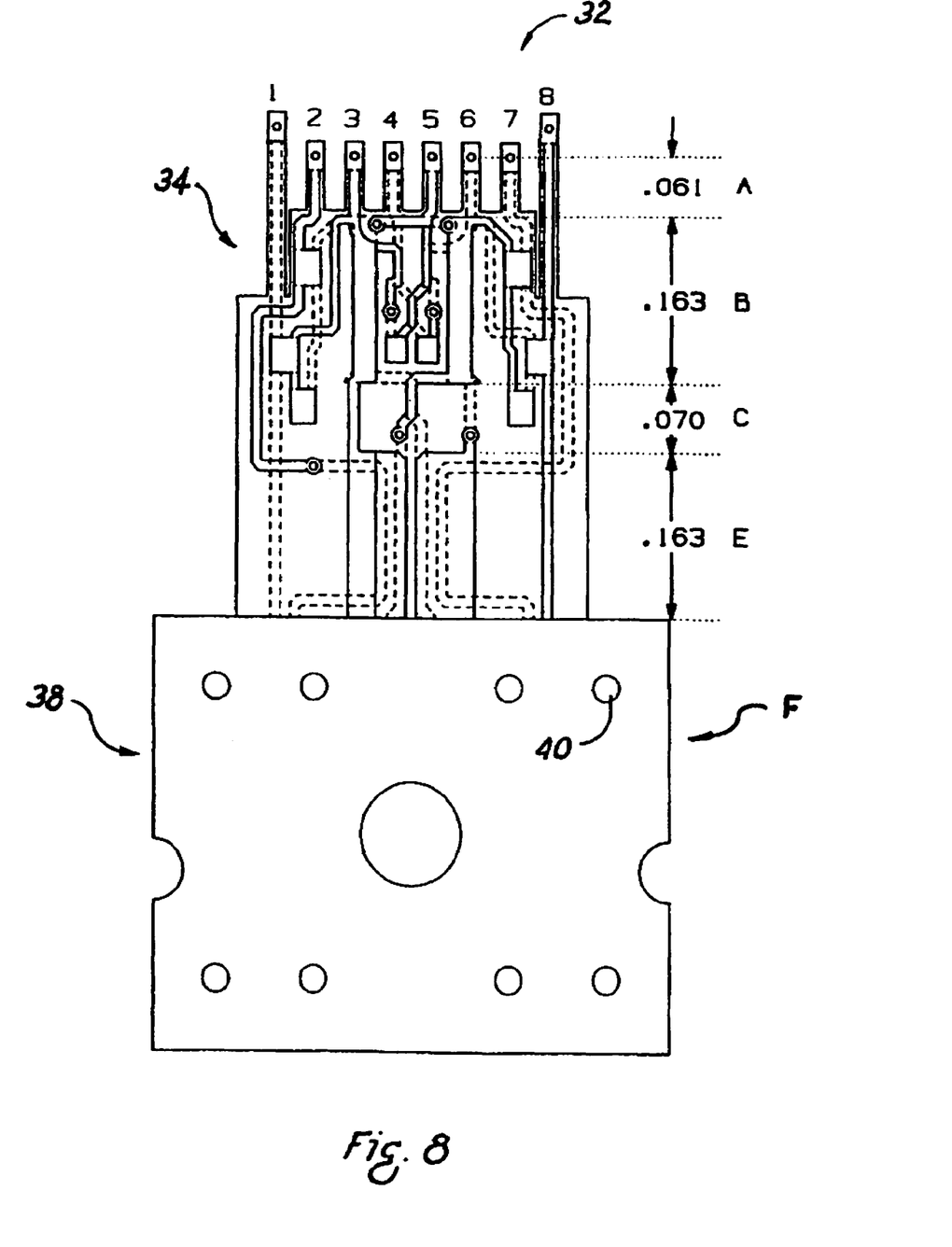
FIG. 8 is a plan view of a printed circuit board showing a flexible portion and a rigid portion.

Zone F is a neutral zone which connects the NEXT crosstalk zone to IDC sockets 40 as shown in FIG. 8.

Zone G is a variable compensation zone which reduces NEXT compensation as frequency increases.

FIG. 3 shows the approximate lengths of Zones A, B, C, and E in inches.

Within Zones B, D, and F, some conductive traces have capacitive plates that allow for capacitive compensation between conductors. These capacitive couplings are labeled in FIG. 3 as "$C_{x,y}$" where x is the corresponding conductive trace along the top of the flexible portion 34 and y is the corresponding conductive trace along the bottom of the flexible portion 34 that is capacitively coupled at that coupling. For example, $C_{2,5}$ as shown in FIG. 3 is a capacitive coupling between the second conductive trace on the top and the fifth conductive trace on the bottom.

Figure 4:
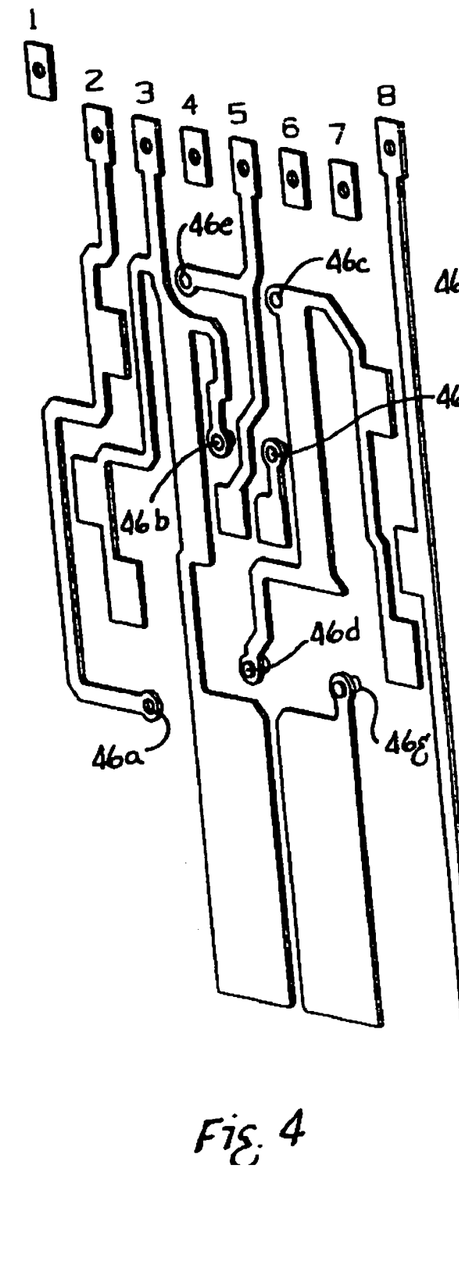
FIG. 4 is a perspective view of an upper conductive trace of the flexible portion of FIG. 3.
Figure 5:
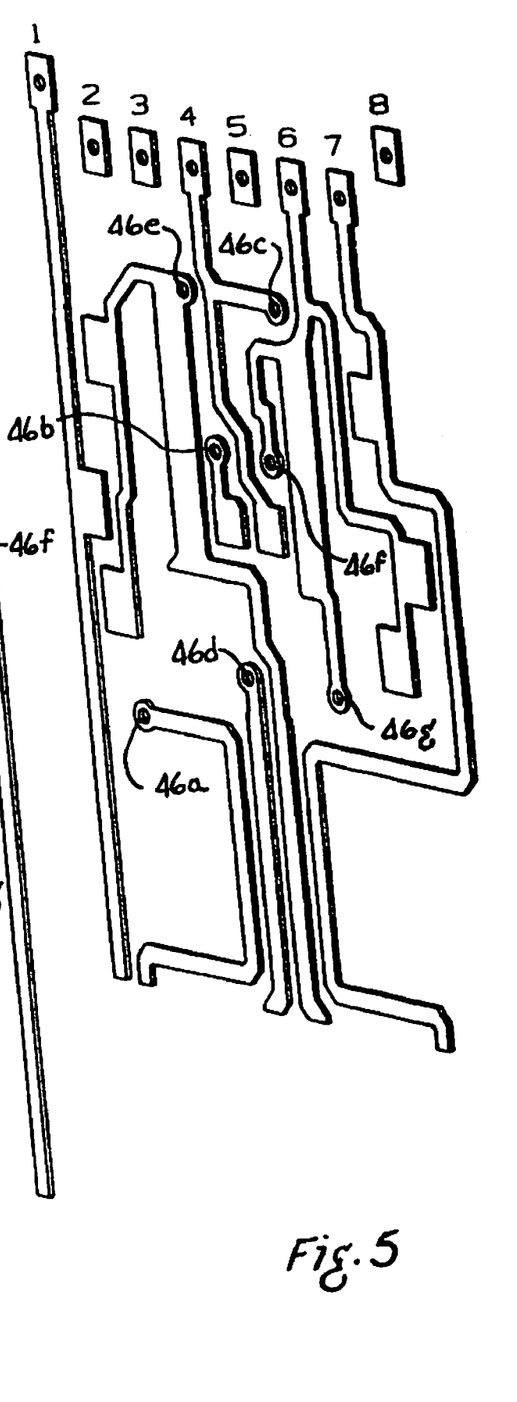
FIG. 5 is a perspective view of a lower conductive trace of the flexible portion of FIG. 3.

All of the conductive traces except the first, the seventh, and the eighth transfer between the top and bottom of the flexible portion 34 through conductive vias 46a-g as shown in FIGS. 3-5.

The flexible portion 34 of the PCB 32 of the present invention incorporates additional features that help to accommodate the use of either six- or eight-contact plugs in the communications jack 10. As shown in FIG. 3 and as described in more detail below, elongated connection extensions 42a and 42h are provided for the first and eighth jack contact points 36a and 36h. Further, first and second slits 44a and 44b are cut into the flexible portion 34 to allow the elongated connection extensions 42a and 42h to bend more than the connection extensions of the second through seventh jack contact points 36b-36g.

Figures 6, 7:
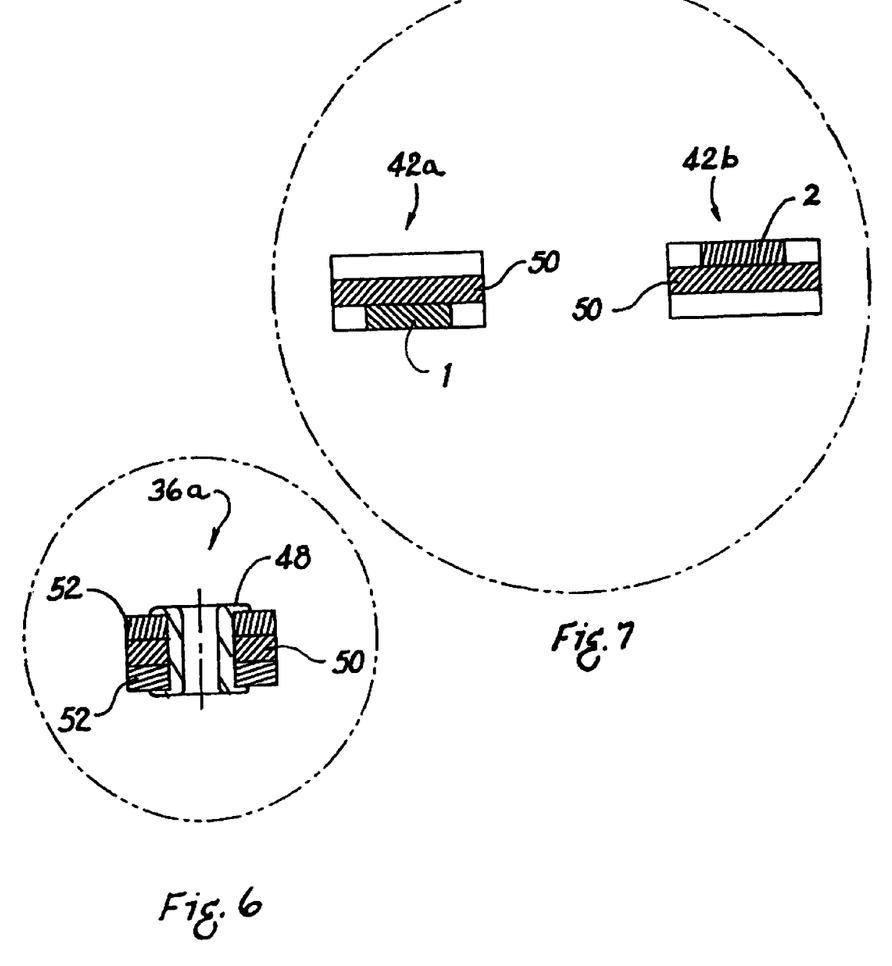
FIG. 6 is a cross-sectional view along the line 6-6 of FIG. 3.
FIG. 7 is a cross-sectional view along the line 7-7 of FIG. 3.

FIGS. 6 and 7 show cross-sectional views of the flexible portion 34, respectively, along the lines 6-6 and 7-7 of FIG. 3. FIG. 6 shows a cross-section through a contact point via 48 where the first jack contact point 36a is connected to the first plug interface contact 24. The cross-section shows a flexible core 50 manufactured, for example, of KAPTON polyimide film. Contact pads 52 are provided along the top and bottom layers in the area of the jack contact points 36. The via 48 is conductive and may be copper plated. FIG. 7 shows a cross-section through connection extensions 42a and 42b, respectively associated with the first and second conductors as shown in FIG. 3. Each of the cross-sections shows a flexible core. A trace 1 associated with the first conductor is shown on the bottom layer in FIG. 7, and a trace 2 associated with the second conductor is shown on the top layer.

FIG. 8 is a plan view of the printed circuit board 32 showing the flexible portion 34 and the rigid portion 38. The rigid portion includes the IDC sockets 40 and the conductive traces of Zone F.

Figure 9:
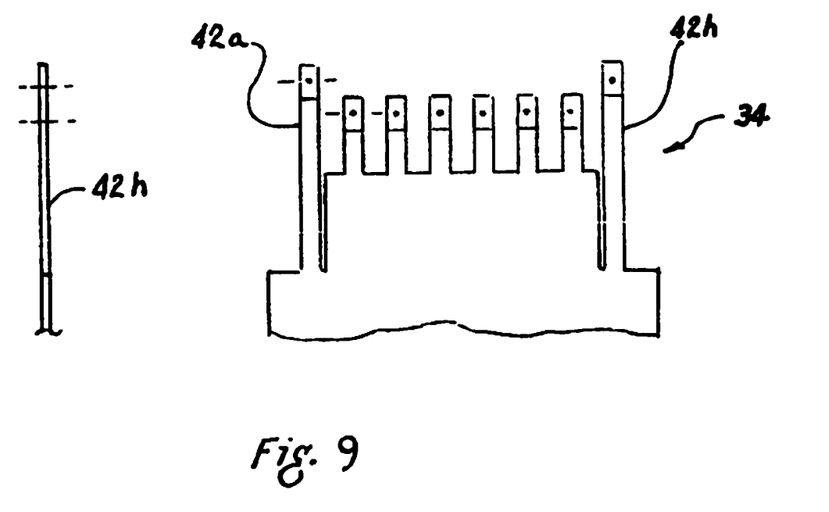
FIG. 9 is a diagram showing a side view and a plan view of jack contact points of a flexible portion of a printed circuit, with first and eighth connection extensions shown in extended positions.
Figure 10:
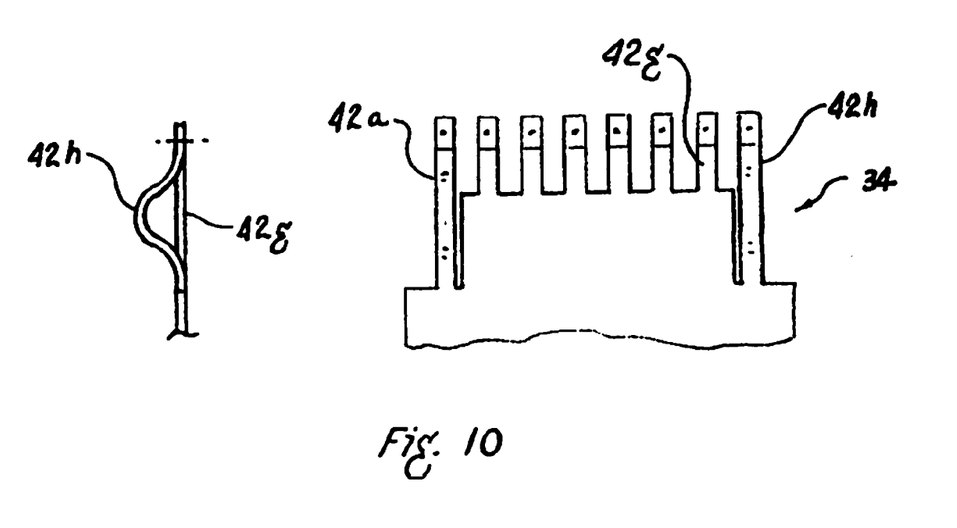
FIG. 10 is a diagram showing a side view and a plan view of jack contact points of a flexible portion of a printed circuit, with first and eighth connection extensions shown in bent positions.
Figure 11:
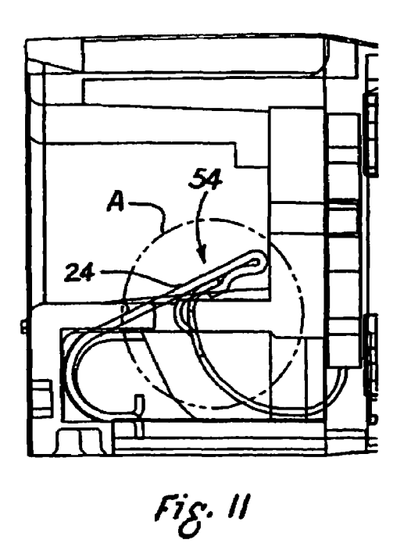
FIG. 11 is a side cross-sectional view of a communications jack showing the attachment of a flexible portion of a printed circuit board to plug interface contacts.
Figure 12:
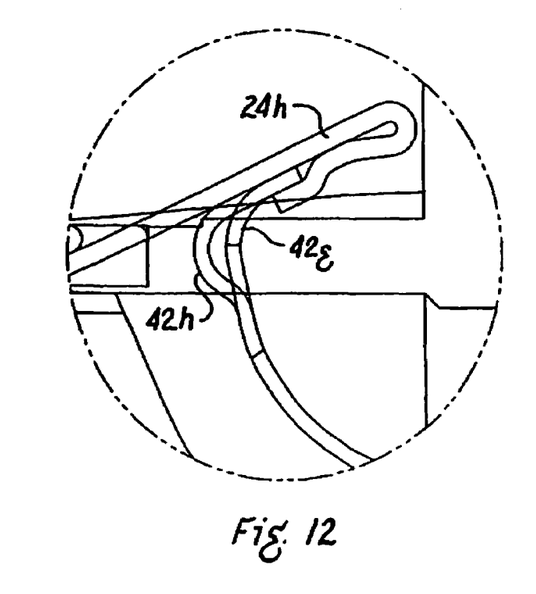
FIG. 12 is a view of the detail "A" of FIG. 11.

Turning now to FIGS. 9 and 10, two diagrams illustrate the adaptation of the flexible portion 34 of the PCB to accommodate both six- and eight-conductor plugs. As described in U.S. patent application Ser. No. 11/078,816 and further as shown in FIG. 10, the plug-jack interface is disposed directly above the contact between the plug interface contacts 24 and a flexible circuit board (or flexible portion of a circuit board). These contact locations are approximately located on a straight line when no plug is installed (as shown in FIGS. 11 and 12) or when a standard eight-contact plug is installed. However, when a six-contact plug is installed (as shown in FIGS. 13 and 14), contacts 1 & 8 deflect more than contacts 2 to 7.

The Zone A connection extensions 42a and 42h which connect traces 1 and 8 to jack contacts 1 and 8 have been lengthened—as shown in FIG. 9—and an "S" bend—as shown in FIG. 10—has been incorporated to facilitate the additional deflection of contacts 1 and 8 compared to the deflection of contacts 2 to 7 when a six-contact plug is installed in the jack.

Figure 13:
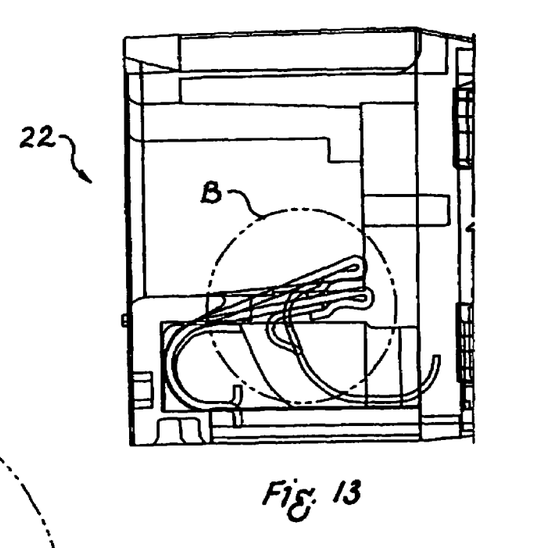
FIG. 13 is a side cross-sectional view of a communications jack showing the bending of plug interface contacts upon insertion of a six-contact plug.
Figure 14:
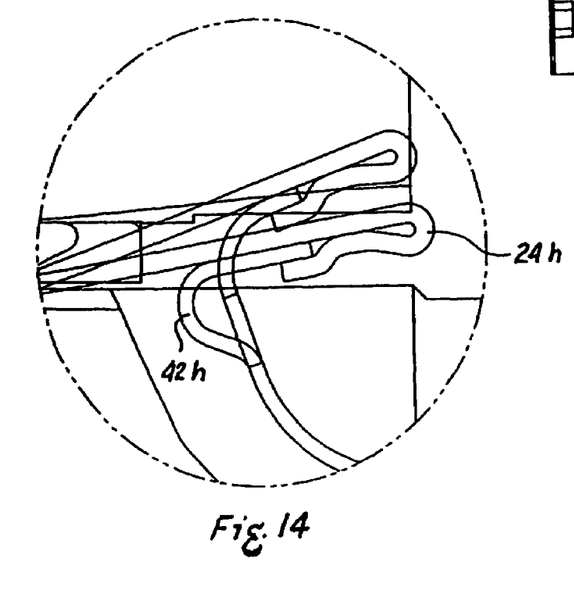
FIG. 14 is a view of the detail "B" of FIG. 13.

As shown in FIGS. 13 and 14, the longer connection extension 42h associated with the eighth trace allows for the greater deflection of the plug interface contact 24h (associated with the eighth conductor) when a six-contact plug is inserted into the receptacle 22.

Figure 15:
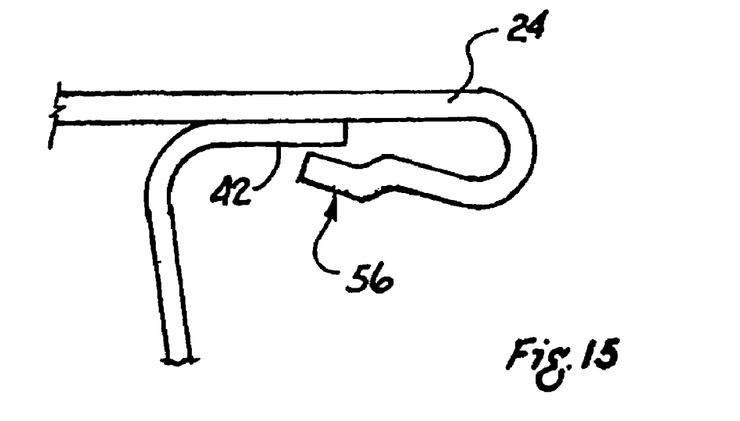
FIGS. 15-17 are step-by-step side views showing the attachment of a flexible portion of a printed circuit board to crimped and welded plug interface contacts.
Figure 16:
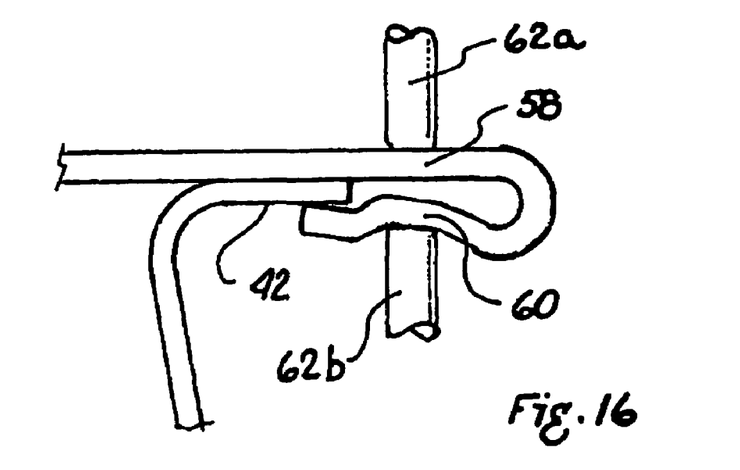
Figure 17:
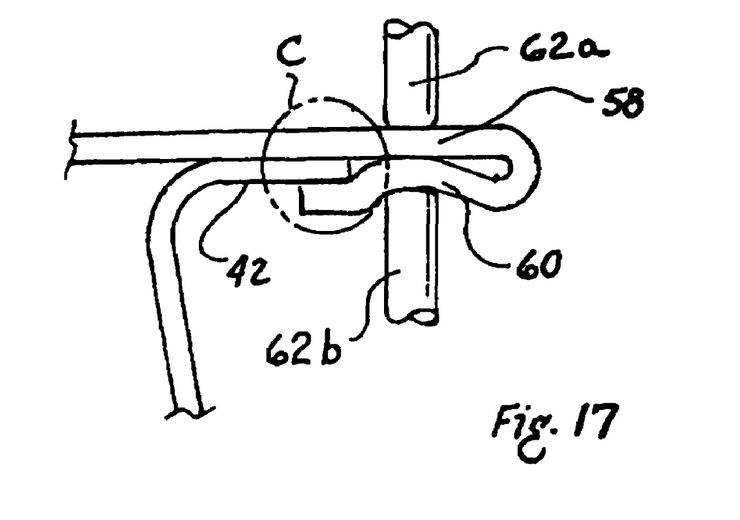

A preferred design of the mechanical and electrical connection of the flexible portion 34 of the PCB 32 to the plug interface contacts 24 adjacent to and on the opposite side of the plug-jack interface 54 is shown in FIGS. 15-17. The connection is made by bending the free tips 56 of the plug interface contacts 24 back on themselves, as shown in FIG. 15, and by spot-welding two sections 58 and 60 of each contact together adjacent to the connection extensions 42 of the flexible portion 34 of the PCB 32. The connection extensions 42 are sandwiched between the two sections 58 and 60 of each contact. The spot-welding step as shown in FIGS. 16 and 17 may be performed with welding electrodes 62a and 62b.

Figure 18:
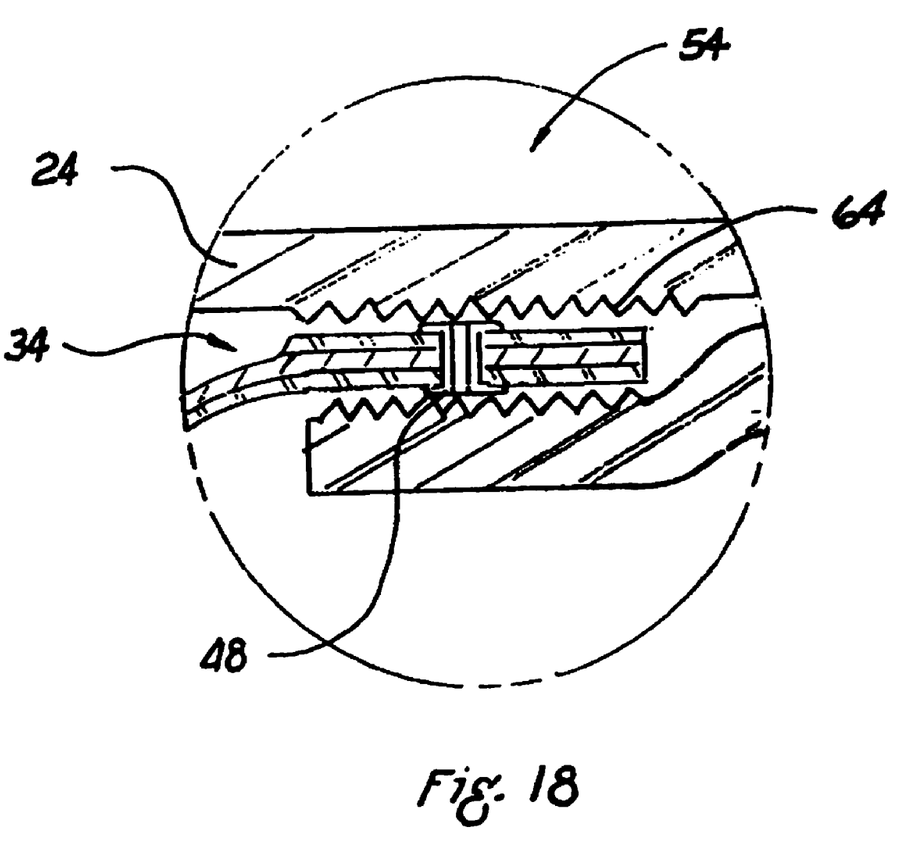
FIG. 18 is a detailed view showing the jack contact point of a flexible portion of a printed circuit board held within a crimped and welded plug interface contact.

Crimping and welding the contacts as described provides frictional force allowing the plug interface contacts to grip the connection extensions 42. As shown in FIG. 18, the plug interface contacts 24 may be provided with gripping features 64 in the region where they contact the contact point via 48, beneath the plug-jack interface 54. The grip of the plug interface contacts 24 on the via 48 can be enhanced by a number of methods such as coining, serrating, or abrading the contacts or roll-forming teeth on the contacts 24.

Figure 19:
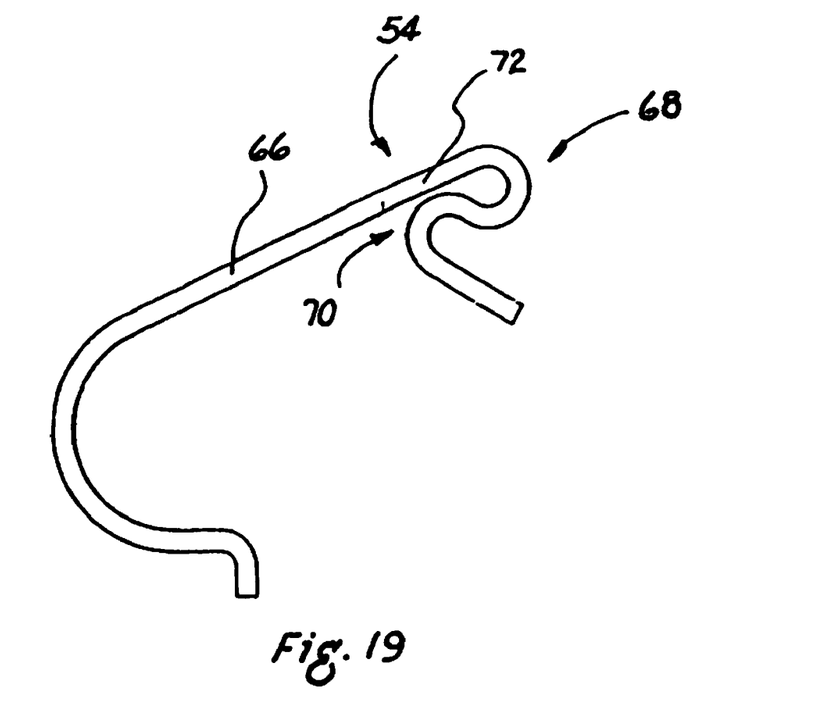
FIG. 19 is a side view of a plug interface clip contact.
Figure 20:
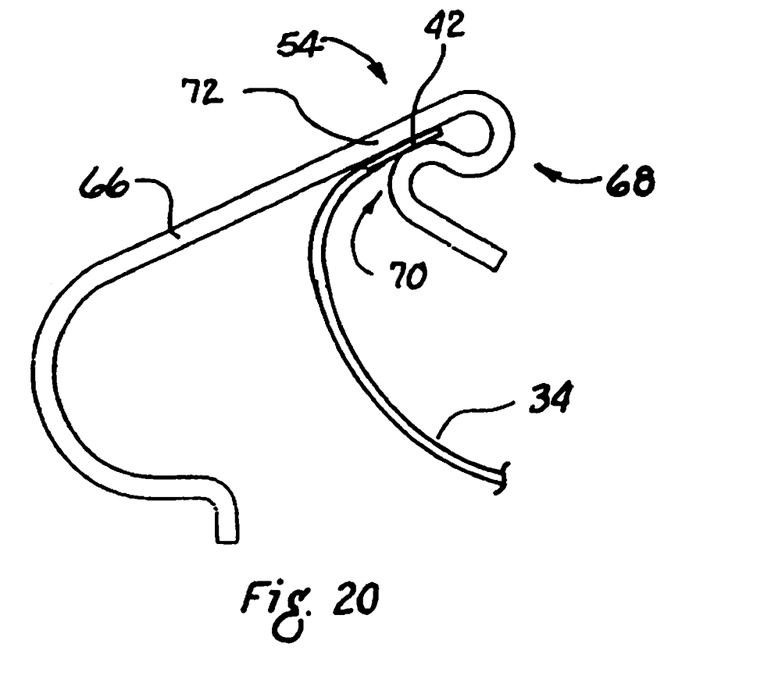
FIG. 20 is a side view of a plug interface clip contact with a flexible printed circuit clipped to the contact.

FIGS. 19 and 20 show an alternative way to connect a flexible printed circuit board or a flexible portion 34 of a circuit board to a jack contact. In this embodiment, the jack contacts are clip contacts 66 that are provided with first and second bends 68 and 70. The connection extensions 42 of the flexible portion 34 of a circuit board are held beneath the plug-jack interface by friction between the second bends 70 of the clip contacts 66 and straight portions 72 of the clip contacts.

While the discussion above addresses the connection of a flexible portion of a PCB to plug interface contacts, it is to be understood that this connection method may also be used with flexible printed circuits (FPCs) that do not contain rigid portions.

While the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation.

The invention claimed is:

1. A method for manufacturing a crosstalk compensation apparatus for a modular communications connector, said method comprising:
providing a flexible printed circuit having circuit traces to compensate for near-end crosstalk (NEXT);
providing a plurality of plug interface contacts; and
mechanically and electrically connecting said flexible printed circuit board to said plurality of plug interface contacts by clamping the flexible printed circuit board between an end portion and an intermediate portion of each plug interface contact at a clamping area of each plug interface contact.

2. The method of claim 1 further comprising welding together portions of each plug interface contact adjacent to the clamping area.

3. The method of claim 1 further comprising providing each of said clamping areas with at least one irregular surface which contacts gripped portions of the flexible printed circuit.

4. The method of claim 1 further comprising providing first through eighth flexible connection extensions on the flexible printed circuit;
wherein said step of mechanically and electrically connecting said flexible printed circuit board to said plurality of plug interface contacts comprises clamping said flexible connection extensions between said end portions and said intermediate portions of said plug interface contacts.

5. The method of claim 4 further comprising:
providing eight of said plug interface contacts; and
providing eight of said flexible connection extensions on said flexible printed circuit board, first and eighth of said flexible connection extensions being longer than second through seventh of said flexible connection extensions.

6. The method of claim 5 further comprising providing S-shaped bends in said first and eighth flexible connection extensions.

7. A method for manufacturing a crosstalk compensation apparatus for a modular communications connector, said method comprising:
providing a flexible printed circuit having circuit traces to compensate for near-end crosstalk (NEXT), said flexible printed circuit having a variable compensation zone that reduces NEXT compensation as a communication frequency increases;
providing a plurality of plug interface contacts;
providing a plurality of network cable connectors; and
mechanically and electrically connecting said flexible printed circuit board at a first end to said plug interface contacts and at a second end to said network cable connectors.

8. The method of claim 7 wherein said step of mechanically and electrically connecting said flexible printed circuit board to said plug interface contacts comprises clamping the flexible printed circuit board between an end portion and an intermediate portion of each plug interface contact at a clamping area of each plug interface contact.

9. The method of claim 8 further comprising welding together portions of each plug interface contact adjacent to the clamping area.

10. The method of claim 7 further comprising providing each of said clamping areas with at least one irregular surface which contacts gripped portions of the flexible printed circuit.

11. The method of claim 8 further comprising providing first through eighth flexible connection extensions on the flexible printed circuit;
wherein said step of mechanically and electrically connecting said flexible printed circuit board to said plurality of plug interface contacts comprises clamping said flexible connection extensions between said end portions and said intermediate portions of said plug interface contacts.

12. The method of claim 11 further comprising:
providing eight of said plug interface contacts; and
providing eight of said flexible connection extensions on said flexible printed circuit board, first and eighth of said flexible connection extensions being longer than second through seventh of said flexible connection extensions.

13. The method of claim 12 further comprising providing S-shaped bends in said first and eighth flexible connection extensions.

14. The method of claim 8 further comprising providing a clamping force on said flexible printed circuit board via said plug interface contacts, said clamping force resulting from a separation of said end portions and said intermediate portions of said plug interface contacts which are spring loaded together by the configuration of each contact.

* * * * *